US009881775B2

(12) United States Patent
Stowell, Jr.

(10) Patent No.: US 9,881,775 B2
(45) Date of Patent: Jan. 30, 2018

(54) WAVEFORM FOR IMPROVED ENERGY CONTROL OF SPUTTERED SPECIES

(71) Applicant: ITN Energy Systems, Inc., Littleton, CO (US)

(72) Inventor: Michael Wayne Stowell, Jr., Loveland, CO (US)

(73) Assignee: ITN ENERGY SYSTEMS, INC., Littleton, CO (US)

(*) Notice: Subject to any disclaimer, the term of this patent is extended or adjusted under 35 U.S.C. 154(b) by 0 days.

(21) Appl. No.: 14/894,264

(22) PCT Filed: May 1, 2014

(86) PCT No.: PCT/US2014/036388
§ 371 (c)(1),
(2) Date: Nov. 25, 2015

(87) PCT Pub. No.: WO2014/209497
PCT Pub. Date: Dec. 31, 2014

(65) Prior Publication Data
US 2016/0118233 A1    Apr. 28, 2016

Related U.S. Application Data

(60) Provisional application No. 61/839,712, filed on Jun. 26, 2013.

(51) Int. Cl.
*C23C 14/34*    (2006.01)
*H01J 37/34*    (2006.01)
*C23C 14/54*    (2006.01)

(52) U.S. Cl.
CPC ...... *H01J 37/3464* (2013.01); *C23C 14/3485* (2013.01); *C23C 14/54* (2013.01);
(Continued)

(58) Field of Classification Search
CPC ...... C23C 14/3485; C23C 14/54; H01J 37/34; H01J 37/3444; H01J 37/3464; H01J 37/3467
(Continued)

(56) References Cited

U.S. PATENT DOCUMENTS

2002/0084181 A1    7/2002    Gopalraja et al.
2003/0173207 A1    9/2003    Zhang et al.
(Continued)

OTHER PUBLICATIONS

International Search Report and Written Opinion for corresponding International Patent Application No. PCT/US2014/036388, dated Sep. 16, 2014.

*Primary Examiner* — Rodney McDonald

(57) ABSTRACT

This disclosure describes systems and methods for regulating the density and kinetic energy of ions in a sputtering deposition chamber. A pulsed DC waveform with a modulated RF signal is generated and applied to the sputtering chamber. Upon termination of a cycle of the pulsed DC waveform, a reverse voltage spike is generated. This reverse voltage spike reverses the polarity of the cathode and anode of the sputtering chamber for some period of time. A reverse voltage limiting circuit is provided so as to limit the reverse voltage spike to a selected reverse voltage threshold. A controller may be employed to control the timing and duration of the application of the DC waveform, the timing and duration of the RF waveform, and the engagement of the reverse limiting circuit.

17 Claims, 10 Drawing Sheets

(52) U.S. Cl.
CPC .......... *H01J 37/34* (2013.01); *H01J 37/3444* (2013.01); *H01J 37/3467* (2013.01)

(58) Field of Classification Search
USPC ........................................ 204/298.08, 192.12
See application file for complete search history.

(56) References Cited

U.S. PATENT DOCUMENTS

| | | |
|---|---|---|
| 2004/0026235 A1 | 2/2004 | Stowell, Jr. |
| 2006/0134522 A1 | 6/2006 | Zhang et al. |
| 2006/0283702 A1* | 12/2006 | Hosokawa ............... C23C 14/35 204/192.1 |
| 2007/0218623 A1 | 9/2007 | Chua et al. |

* cited by examiner

WAVEFORM FOR IMPROVED ENERGY CONTROL OF SPUTTERED SPECIES

This application is a National Stage Application of International Application No. PCT/US2014/036388, filed on 1 May 2014, which claims the benefit of U.S. Provisional Patent Application No. 61/839,712, filed Jun. 26, 2013, which applications are incorporated herein by reference. To the extent appropriate, a claim of priority is made to each of the above disclosed applications.

Thin film devices, including electrochromic devices and batteries, have a variety of applications. Flat panel displays, semiconductors, flexible displays, electrochromic windows, and touch screen displays may all incorporate thin film devices.

One technique to create thin film devices is sputtering deposition. Sputtering deposition technology may use electromagnetic fields to accelerate charged particles (ions) into a target. The force of the resulting collision may eject surface material from the target. The ejected material will have a velocity, mass, and direction. The direction of the material may cause the material to be deposited onto the surface of a substrate, such as a glass or a flexible polymer. When a sufficient amount of material has been ejected from a target and deposited on a substrate, a thin film may form on the surface of the substrate.

The target material may be affected by a reactive gas present in the sputtering deposition chamber. In some sputtering techniques the material at the surface of the target reacts with the gas to form a compound. In other sputtering techniques the reaction with the target material occurs after ejection. Still in others, the reaction occurs after deposition on the substrate. Conversely, some sputtering techniques use only an inert gas inside the sputtering chamber, and no reaction occurs.

Controlling the kinetic energy of the ions may be desirous. For example, the kinetic energy of the ions affects the kinetic energy of the ejected target material. Material striking a substrate with too high a kinetic energy may destroy the structure of material previously deposited onto the substrate. Material having too low of a kinetic energy may fail to form proper lattice structures. Indeed, material with kinetic energy that fails to overcome the Schwoebel-Ehrlich barrier may result in a substrate with a surface microstructure having interstitial voids. This will affect the properties of the deposited layer and ultimately the device itself.

Additionally, the ions themselves may be directed toward a substrate by modifying the electromagnetic field in a sputtering deposition chamber. Similar to the ejected target material, controlling the kinetic energy of the ions striking a substrate may be desirous. Ions with too high a kinetic energy will damage the structure of material previously deposited onto the substrate. Ions with an appropriate amount of kinetic energy, however, will transfer enough energy to the previously deposited material to allow the deposited material to overcome the Schwoebel-Ehrlich barrier. This may improve the lattice structure of the deposited material.

Further, controlling the density of ions in the sputtering deposition chamber may also be desirous. The more ions generated, the more ions that may be directed toward a substrate. This may allow faster deposition of sputtered material in sputtering techniques where the rate of deposition is limited by the number of ions that bombard a substrate.

It is with respect to these and other considerations that embodiments have been made. Also, although relatively specific problems have been discussed, it should be understood that the embodiments should not be limited to solving the specific problems identified herein.

Waveform for Improved Energy Control of Sputtered Species

This disclosure describes systems and methods for regulating the density and kinetic energy of ions in a sputtering deposition chamber. A pulsed DC waveform with a modulated RF signal is generated and applied to the sputtering chamber. Upon termination of a cycle of the pulsed DC waveform, a reverse voltage spike is generated. This reverse voltage spike reverses the polarity of the cathode and anode of the sputtering chamber for some period of time. A reverse voltage limiting circuit is provided so as to limit the reverse voltage spike to a selected reverse voltage threshold. A controller may be employed to control the timing and duration of the application of the DC waveform, the timing and duration of the RF waveform, and the engagement of the reverse limiting circuit.

Embodiments of the present disclosure include a method for controlling the rate of production and energy distribution of ions in a sputtering system. The method includes applying a first cycle of a pulsed-DC waveform to a cathode of a sputtering deposition chamber. The cycle of the pulsed-DC waveform includes a plasma initiation portion, a steady-state portion, and a reverse DC voltage portion. The reverse DC voltage portion reverses the polarity of a cathode in a sputtering deposition chamber. The cycle of the pulsed-DC wave form includes a reverse voltage threshold and a pulsed-DC termination point. Additionally, the method includes applying a first RF waveform to the cathode of the sputtering deposition chamber during at least the steady-state portion. The RF waveform includes a frequency and an RF application duration.

Additionally the disclosure includes an embodiment of a system for controlling the power applied to cathode of a sputtering deposition chambers. The system includes a pulsed-DC power supply. The pulsed DC-power supply applies a waveform to a cathode. The waveform includes a plasma initiation portion, a steady-state portion, and a reverse DC voltage portion. The reverse DC voltage portion reverses the polarity of a cathode in a sputtering deposition chamber. The system includes an RF power supply and a voltage limiting device. The voltage limiting device has a reverse limiting threshold that limits the amount the voltage applied to the cathode is reversed during the reverse DC voltage portion. Additionally, the system includes a control circuit. The control circuit is designed to control the pulsed-DC power supply, the RF power supply, and the reverse voltage limiting device.

Other embodiments include a method for controlling the rate of production and energy distribution of ions in a sputtering system where the method includes applying a pulsed DC waveform to a cathode of a sputtering deposition chamber and applying an RF waveform to a cathode of a sputtering deposition chamber.

DETAILED DESCRIPTION

The systems and methods described herein are directed at applying energy to a cathode in a sputtering deposition chamber for thin film creation. The waveform of the applied energy may be such that ion generation rates and energy distributions are controlled. Further, the kinetic energy transferred to the thin film may also be controlled. Various sputtering systems include rotatable cathode and planar magnetron sputtering systems. The embodiments described herein are described with respect to planar sputtering cathode systems. However, it will be recognized that the technology described herein may be adapted to other sputtering techniques and configurations where ion interaction with deposited materials is desired.

Figure 1:
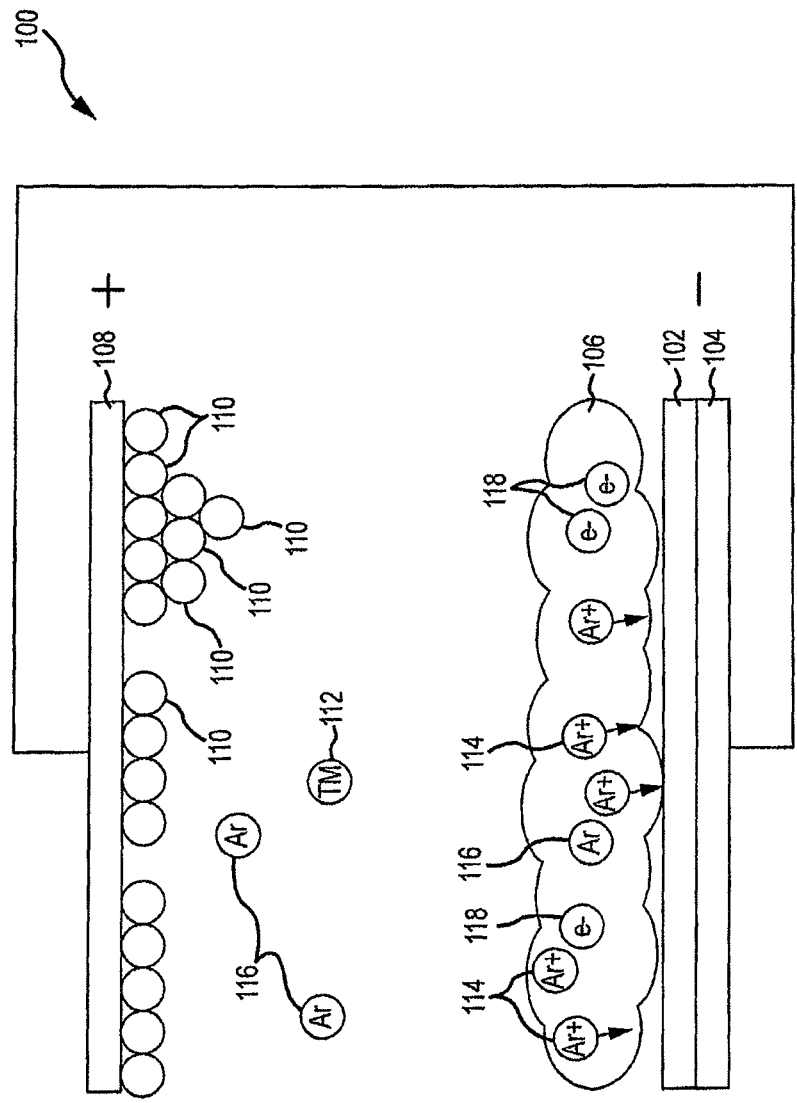
FIG. 1 illustrates the prior art of a planar sputtering cathode system.

FIG. 1 represents prior art of a planar sputtering cathode system 100. Planar sputtering cathode system 100 includes a target 102, a cathode 104, a plasma sheath 106, a substrate 108, deposited material 110, a sputtered species 112, ions 114, and process gas particles 116.

In a planar sputtering cathode system 100, a target 102 may have a magnetic field applied to it. This magnetic field helps contain a plasma sheath 106 to the surface of a target 102 or near the surface of target 102. The magnetic field may confine electrons and secondary electrons to on and/or near the surface of a target. In an embodiment, the characteristics of the magnetic field affect the path of the electrons that travel around the surface of a target 102. The target 102 may be any material suitable for sputtering.

A cathode 104 has a voltage applied to it. In embodiments, a DC current is applied to a cathode 104. This DC current, which may create a 300V energy potential between the cathode 104 and the substrate 108, may be applied in order to ignite the plasma and generate ions 114. Some electrons 118 produced within the plasma sheath 106 have sufficient energy to meet the first ionization potential of the process gas particle 116. Consequently, some process gas particles 116 become positive ions 114.

Ions 114 produced in the plasma sheath 106 have an energy distribution. The energy distribution of the produced ions 114 is dependent on, inter alia, the current applied to the cathode 104, the waveform of that current, and the process gas used in the system.

Positive ions 114 accelerate toward a negatively charged cathode 104. The positive ions may collide with a target 102 and cause a sputtered species 112 to be ejected. Some of the sputtered species 112 will then be deposited onto a substrate 108. As such, sputtered species 112 may be the same material as both the target 102 and the deposited material 110. In other embodiments, the target material reacts with one or more process gases and the resulting compound deposits onto the substrate 108. This reaction may occur at the surface of the target 102, during the travel of sputtered species 112, and/or after material has been deposited on the substrate to form deposited material 110.

Deposited material 110 will form structures, and those structures depend on the kinetic energy of incoming sputtered species 112. For example, a layer of deposited material 110 may be present on the substrate 108. The deposited material 110, given certain process conditions, will form a lattice or crystal structure. A lattice structure occurs when the deposited material 110 is arranged in a substantially ordered manner. In other process conditions, however, a lattice structure will fail to form. Process conditions include the presences of impurities, the kinetic energy of the sputtered species 112 at the time of colliding with deposited material 110, and any other mechanisms that may control the transfer of kinetic energy to the deposited material 110. In embodiments, one such mechanism is to control the energy of ions 114. The relationship between kinetic energy and lattice structure is described more fully with reference to FIG. 2.

In general, the energy of sputtered species 112 is directly proportional to the kinetic energy of the ions 114. For example, some ions 114 collide with the target 102 and transfer energy to the target 102. As a result of this collision, some material of the target 102 is ejected and becomes a sputtered species 112. Thus, high-energy ions 114 striking a target 102 will cause sputtered species 112 to have a greater kinetic than low-energy ions 114. Additionally, upon striking the substrate 108, the sputtered species 112 transfers kinetic energy to the previously deposited material 110.

Another way ions 114 may affect the kinetic energy transferred to deposited material 110 is through ion 114 bombardment of the deposited material 110. For example, in instances where the polarity of the cathode is reversed, the positive ions 114 may accelerate toward a negatively charged substrate 108. In another embodiment, the substrate 108 does not hold a charge and the positive ions 114 accelerate toward a negatively charged area near a substrate 108. Ions 114 with a high kinetic energy that collide with deposited material 110 will transfer more kinetic energy than ions 114 with a lower kinetic energy. Furthermore, the more ions 114 that bombard deposited material 110, the more kinetic energy will transfer to the deposited material 110. Thus, the rate of ion 114 bombardment affects the kinetic energy transferred to deposited material 110.

Figure 2:
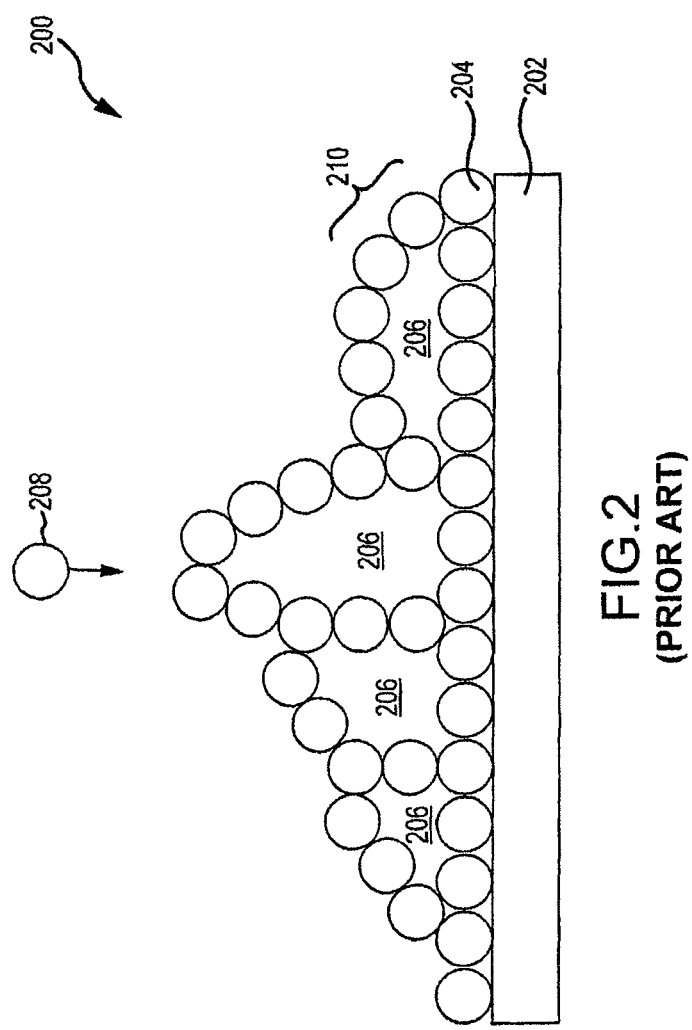
FIG. 2 illustrates a thin film with interstitial voids.

With respect to FIG. 2, FIG. 2 illustrates a thin film 200. In the embodiment shown, a substrate 202 is illustrated with a thin film of deposited material 204. Thin films with interstitial voids are known in the art. The deposited thin film 200 is illustrated as having a substrate 202, a deposited material 204, interstitial voids 206, and a sputtered species 208.

For certain thin films, it may be desirous to remove or limit the number of interstitial voids 206 that may form during deposition. For example, interstitial voids increase the electrical resistivity of thin films for certain materials. Controlling the transfer of kinetic energy to deposited material 204 may limit the number of interstitial voids 206 that form during deposition, and thus reduce the electrical resistivity of the thin film.

For certain deposited materials 204, interstitial voids 206 occur when a target material fails to have sufficient kinetic energy to meet or overcome the Schwoebel-Ehrlich barrier.

Failure to meet the Schwoebel-Ehrlich barrier causes deposited material 204 to form sloping regions 210. Sloping regions 210 tend to cause interstitial voids 206. On the other hand, deposited material 204 that has sufficient energy to overcome the Schwoebel-Ehrlich barrier may form a surface with a high surface symmetry. That is, the deposited material 204 will form less sloping regions and arrange more evenly across the surface of the substrate 202. As such, transfer of kinetic energy to a deposited material 204 may allow the deposited material 204 to have a sufficient energy to overcome the Schwoebel-Ehrlich barrier.

Additionally, it may also be desirous to limit the amount of kinetic energy transferred because too much kinetic energy transfer may damage the fidelity of the deposited material's 204 lattice structure. Damaging the lattice structure may also increase the electrical resistivity of a thin film.

Controlling the transfer of kinetic energy may occur by controlling the kinetic energy of incoming sputtered species 208. Controlling the transfer of energy may also occur through controlling ion kinetic energy and the rate of ion bombardment. Energy transfer to a deposited material is discussed further with reference to FIG. 1.

As such, it may be desirable to have an energy waveform applied to a cathode that can create ions at an appropriate rate and an appropriate energy for generating thin films with a targeted electrical resistance. This waveform will be referred to as a finely tuned waveform.

Figure 3:
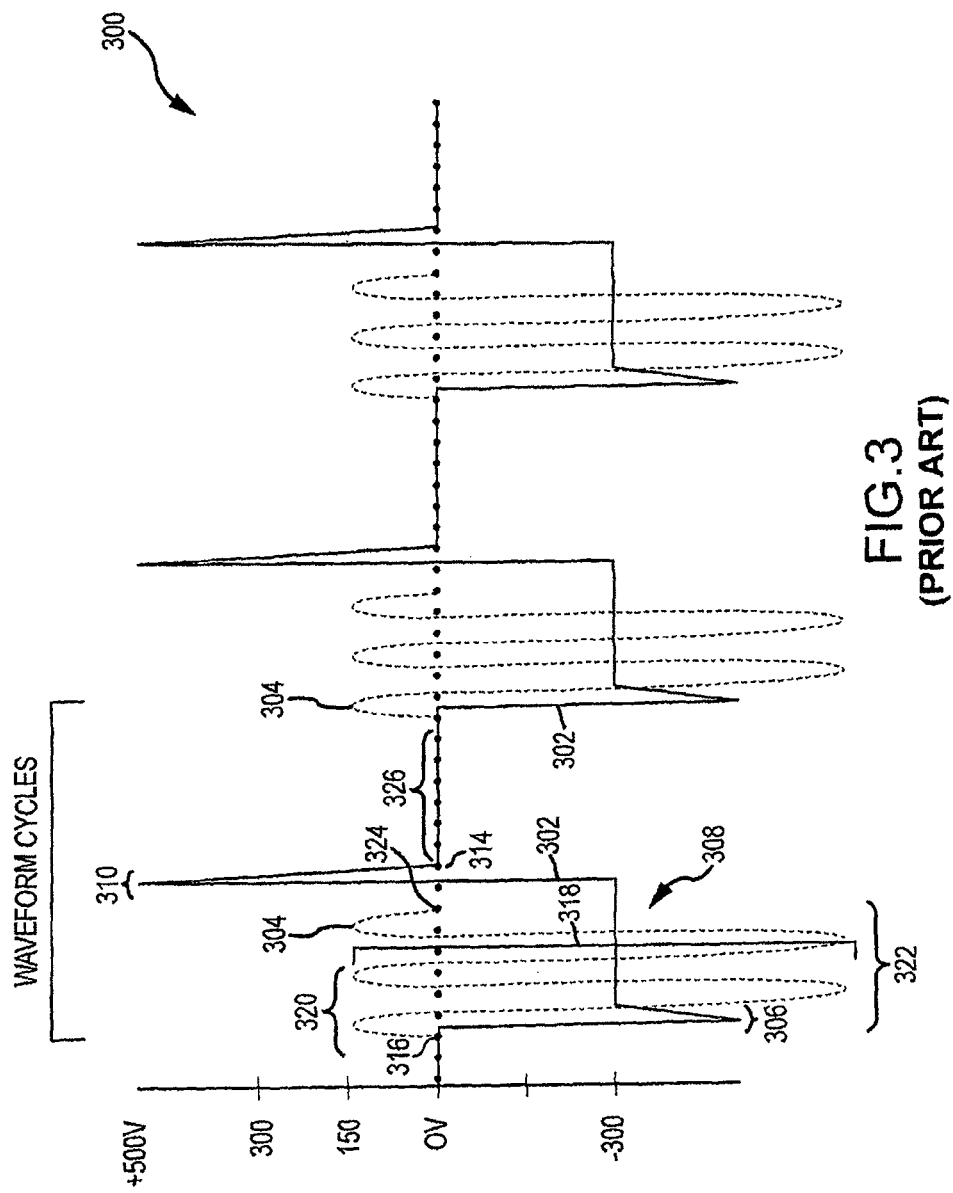
FIG. 3 illustrates the prior art of an RF waveform super positioned on a pulsed DC waveform.
Figure 4:
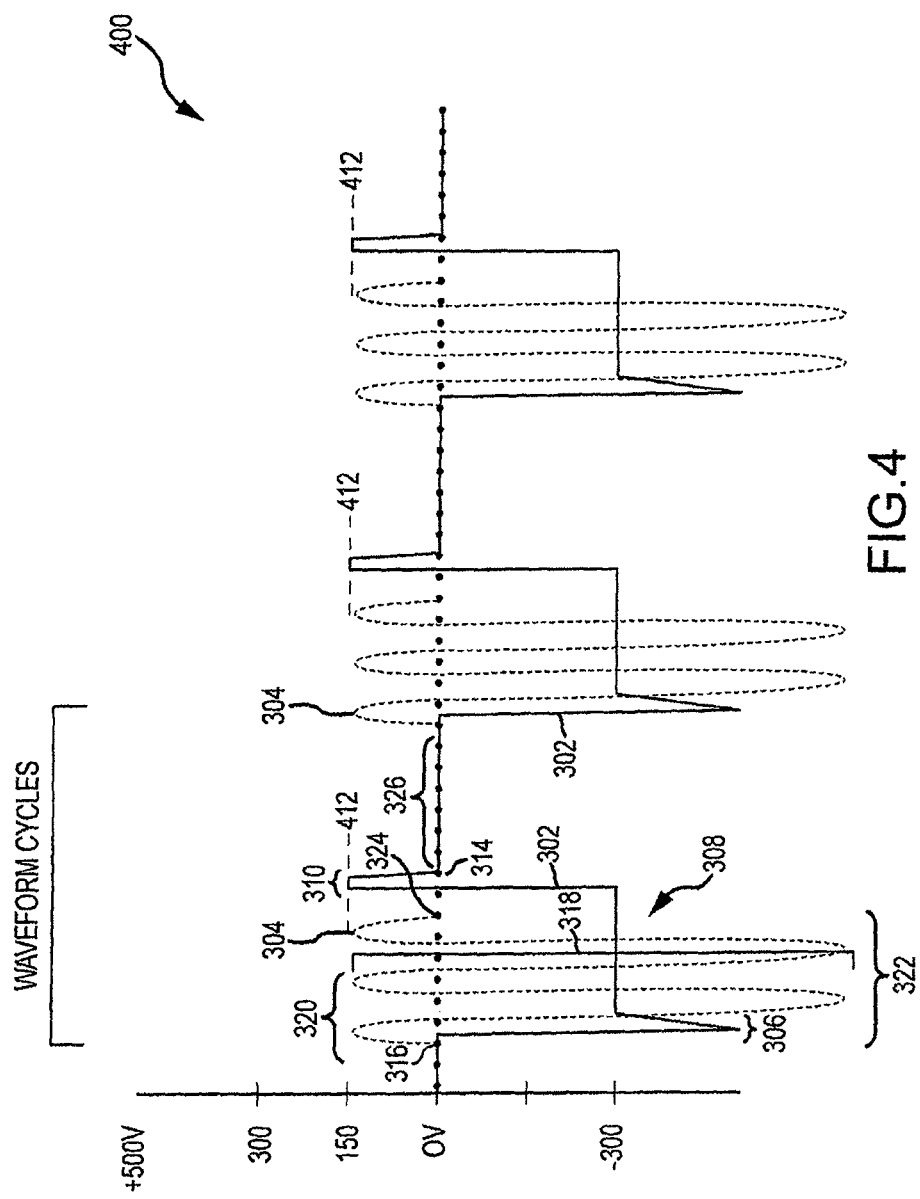
FIG. 4 illustrates a waveform that combines an RF waveform super positioned on pulsed-DC with a reverse voltage limiting threshold.

With reference to FIGS. 3 and 4, FIG. 3 illustrates the prior art of an RF waveform super positioned on a pulsed DC waveform 300. FIG. 4, which is not prior art, illustrates a composite waveform 400 that combines RF super positioned on pulsed-DC with a reverse voltage limiting threshold. Waveform 300 and composite waveform 400 have a pulsed-DC waveform 302 and an RF waveform 304. Composite waveform 400 may be applied to a cathode of a sputtering deposition process in order to adjust the energy of the plasma.

Additionally the pulsed-DC waveform 302 includes a plasma ignition portion 306, a steady-state portion 308, a reverse DC voltage portion 310, and a pulsed-DC termination point 314.

In an embodiment, the application of waveform 300 or composite waveform 400 to a cathode ignites a plasma in a sputtering deposition chamber. The plasma ignition occurs contemporaneous with a plasma ignition portion 306. In another embodiment, the application of an RF waveform 304 causes a plasma to ignite.

During plasma ignition, ions are generated. When a waveform 300 or a composite waveform 400 is applied to a cathode of a sputtering deposition chamber, generation of positive ions continues through the duration of a steady-state portion 308. The positive charge of these ions causes the ions to propel toward a negatively charged cathode. The resulting collision with the target propels target material toward a substrate for deposition. The steady-state portion 308 may have a voltage that is set at −50V, −60V, −70V, −80V, −90V, −100V, −110V, −120V, −130V, −140V, −150V, −160V, −170V, −180V, −190V, −200V, −210V, −220V, −230V, −240V, −250V, −260V, −270V, −280V, −290V, −300V, −310V, −320V, −330V, −340V, −350V, −360V, −370V, −380V, −390V, −400V, −410V, −420V, −430V, −440V, −450V, −460V, −470V, −480V, −490V, and −500V.

In the waveform 300 and composite waveform 400 shown, a reverse DC voltage portion 310 occurs after steady-state portion 308. When applied to a cathode, the reverse DC voltage portion 310 changes the polarity of the cathode from negative to positive.

As shown, waveform 300 and composite waveform 400 have an RF waveform 304 superimposed on the pulsed-DC waveform 302. An RF waveform has an RF initiation point 316, an amplitude 318, a frequency 320, and an RF application duration 322. As illustrated, the waveforms 300 and 400 have an RF power termination point 324.

In embodiments, an RF initiation point 316 may occur at or near the same time as the plasma ignition portion 306. When the waveform 300 or waveform 400 is applied to a cathode, RF initiation point 316 marks the initiation of the application of the RF waveform 304 to a cathode of a sputtering deposition chamber. When applying RF waveform 304 to a cathode, varying the frequency 320 and the amplitude 318 of the RF waveform 304 will generate ions with certain energy distributions. Furthermore, the density of ions created in a plasma sheath is directly proportional to the frequency 320. For example, at 13.56 mhz an RF waveform 304 may create ions at a faster rate than a lower frequency. Ion generation occurs during RF application duration 322 until an RF power termination point 324. RF power termination point 324 may occur sometime before a reverse DC voltage portion 310. Ensuring that the RF power termination point 324 occurs before a reverse DC voltage portion 310 may be accomplished by various analog and digital control techniques, or some combination of the two techniques.

Alternatively, RF is applied continuously until the final waveform cycle. In this embodiment, the RF is applied continuously through all stages of the pulsed-DC waveform 302.

A reverse DC voltage portion 310 may occur by design or may be caused intrinsically by shutting off a DC power supply. When applied to a cathode, the reverse DC voltage portion 310 reverses the polarity of the cathode from negative to positive. When this reversal occurs in a sputtering deposition chamber, the positive ions will accelerate toward the now negatively charged substrate (or a negatively charged area near the substrate). This depletes the ion density of the plasma sheath and substantially halts the deposition of sputtered species. In the prior art waveform 300, the kinetic energy of the ions striking the substrate is directly proportional to the magnitude of the reverse DC voltage portion 310.

In embodiments, it may be desirous to limit the magnitude of the reverse voltage. Composite waveform 400 includes a reverse voltage threshold 412. This limits the magnitude of the reverse voltage limiting portion. Limiting the magnitude of the reverse voltage limits the kinetic energy of the ions accelerating toward the substrate during a reverse DC voltage portion 310.

Limiting the reverse voltage may be accomplished through electronic devices along with analog and digital controllers. In some embodiments where the target is non-metallic, a reverse voltage limiting may interfere with the RF waveform. As described in greater detail below, the systems and methods disclosed herein account for this and prevent interference with the RF waveform while still allowing the reverse DC voltage to be limited.

Application of the reverse voltage threshold 412 may be depend on the specific sputtering environment. For example, in an embodiment where the process gas is Ar, and the deposition material is transparent conductive oxide ("TCO"), a reverse DC voltage portion 310 may last for between 0.5 and 10 microseconds. In embodiments, the reverse DC voltage portion lasts for a microsecond. Additionally, a reverse voltage threshold 312 may be set between 100 and 300 volts.

Furthermore, the composite waveform 400 may be applied at a 10 kHz, 20 kHz, 30 kHz, 40 kHz, 50 kHz, 60 kHz, 70 kHz, 80 kHz, 90 kHz, 100 kHz, 110 kHz, 120 kHz, 130 kHz, 140 kHz, 150 kHz, 160 kHz, 170 kHz, 180 kHz, 190 kHz, 200 kHz, 210 kHz, 220 kHz, 230 kHz, 240 kHz, 250 kHz, 260 kHz, 270 kHz, 280 kHz, 290 kHz, 300 kHz, 310 kHz, 320 kHz, 330 kHz, 340 kHz, 350 kHz, 360 kHz, 370 kHz, 380 kHz, 390 kHz, 400 kHz, 410 kHz, 420 kHz, 430 kHz, 440 kHz, 450 kHz, 460 kHz, 470 kHz, 480 kHz, 490 kHz, or 500 kHz.

As shown, rest period 326 is present in waveform 300 and composite waveform 400. If applied to a cathode, rest period 326 represents the time in which no pulsed-DC power is supplied to the cathode. The rest period 326 is defined as the time between the termination of the application of a DC pulse and the next application of a DC pulse. A rest period may not be present or may be of a short or long duration relative to the DC pulse duration.

A cycle of a waveform 300 or waveform 400 is calculated by summing the time from the first application of power to the cathode until the end of a rest period 326.

Figure 5:
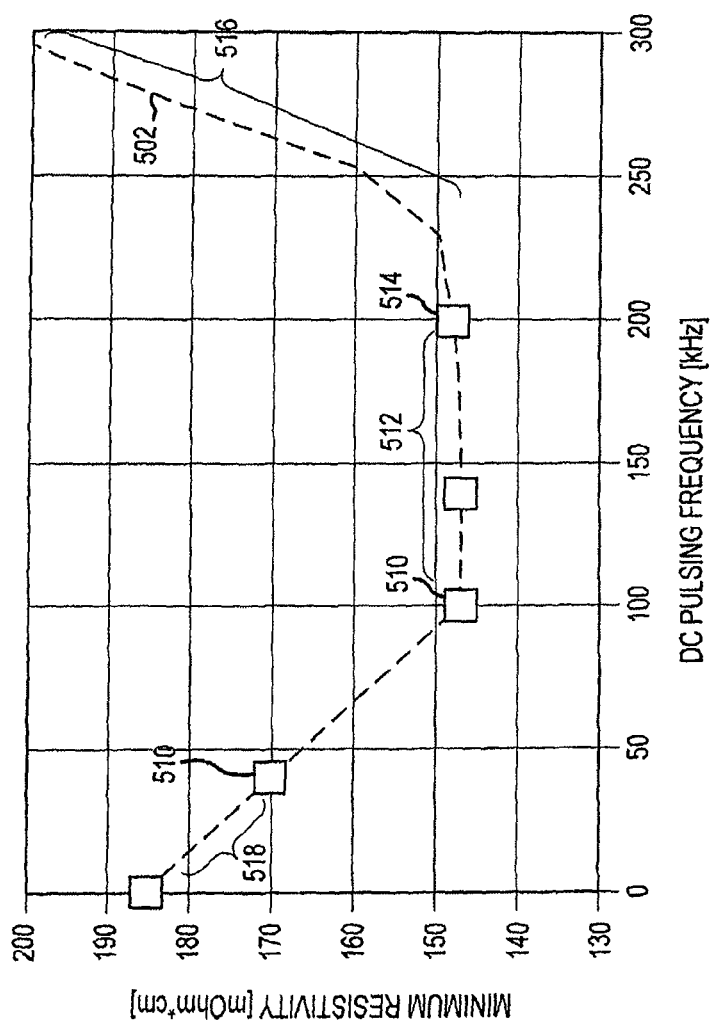
FIG. 5 illustrates the expected resistivity properties of thin films when a waveform 300 is applied to a cathode.

FIG. 5 illustrates the expected resistivity properties of thin films created when a waveform 300 is applied to a cathode. The y-axis of the graph illustrates the minimum resistivity in μOhm*cm. The x-axis represents the frequency at which the DC pulse would be applied to a cathode of a sputtering deposition chamber. Line 502 illustrates the resistivity of a thin-film that may be produced by applying an embodiment waveform 300, i.e., an RF waveform superimposed on pulsed-DC waveform to a cathode of a sputtering deposition chamber.

Line 502 may be understood as having three frequency ranges. In the first range, the minimum resistivity of the thin film decreases in a decreasing resistivity range 508. As illustrated, line 502 illustrates the resistivity decreasing from ~185 to ~148 μOhm*cm over the decreasing resistivity range 508. This corresponds to a frequency of 0 to ~100 kHz DC-pulsed. At a steady-state point 510 the resistivity of the thin film no longer decreases. As illustrated, the steady-state point is ~100 kHz. The steady-state point 510 marks the start of a steady-state range 512. In a steady-state range 512, the resistivity of the produced thin-film does not vary substantially with varying pulsed-DC frequencies. As illustrated, line 502 has a steady-state 512 that corresponds to a frequency range from 100 kHz to ~200 kHz. In some embodiments, at an inflection point 514 the resistivity of the thin film begins to increase. As illustrated, the inflection point 514 for line 502 corresponds to a frequency of ~200 kHz. After the inflection point 514, an increasing resistivity range 516 may be present. In increasing resistivity range 516, the resistivity of the produced thin film increases as frequency of the pulsed-DC increases. As illustrated, line 502 has an increasing resistivity range 516 that corresponds to a frequency of ~200 kHz to at least 300 kHz.

Figure 6:
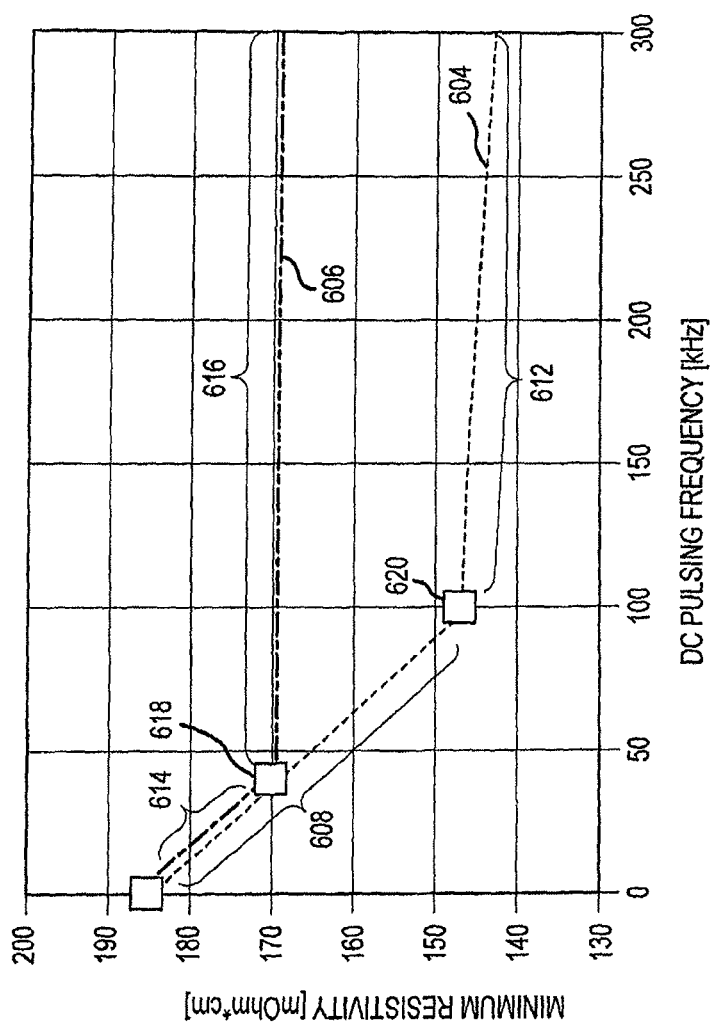
FIG. 6 illustrates the expected resistivity properties of thin films when a composite waveform 400 is applied to a cathode.

FIG. 6 illustrates the expected resistivity properties of thin films created when a composite waveform 400 is applied to a cathode. The y-axis of the graph illustrates the minimum resistivity in μOhm*cm. The x-axis represents the frequency at which the DC pulse would be applied to a cathode of a sputtering deposition chamber. Line 604 illustrates the resistivity of a thin-film that may be produced by applying an embodiment of a composite waveform 400, i.e., an RF waveform superimposed on pulsed-DC waveform combined with reverse voltage limiting. Additionally, line 606 illustrates the resistivity of a thin-film produced that may be produced by applying an alternative embodiment of a composite waveform 400.

Line 604 may be understood as having two areas, a decreasing resistivity range 608 and steady-state range 612. Additionally, line 606 may be understood as having two areas, a decreasing resistivity range 614 and a steady-state range 616. As illustrated, line 604 has a decreasing resistivity range 612 that is greater than the decreasing resistivity range 614 of line 606. In embodiments, this may be because the composite waveform 400 that produced the results illustrated by line 606 has a lower reverse voltage threshold than the composite waveform 400 that produced the results illustrated by line 604.

As illustrated, lines 604 and lines 606 have no increasing resistivity range. This may occur because the composite waveforms 400 used to produce lines 604 and 608 have a reverse limiting voltage threshold. This reverse threshold may ensure that ions that strike the previously deposited material have a sufficiently low kinetic energy.

Figure 7A:
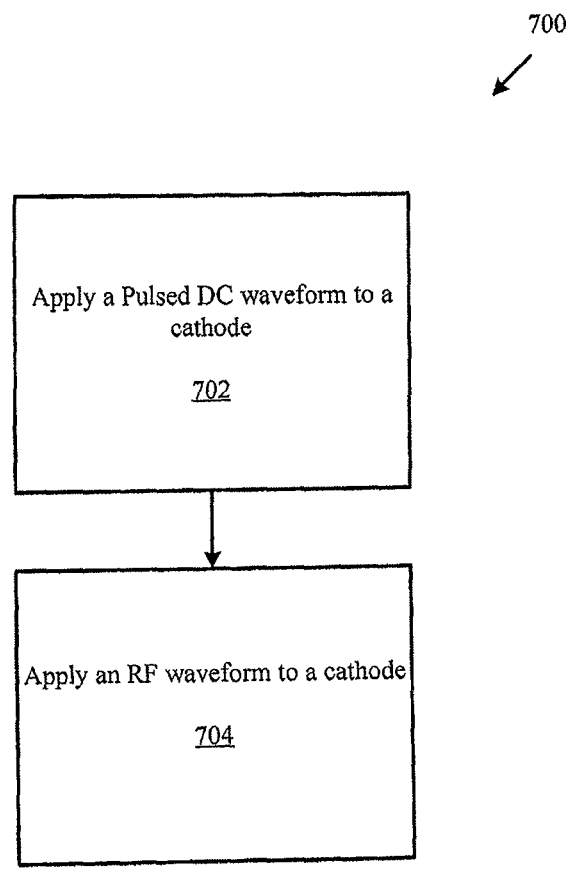
FIG. 7A illustrates a method of applying an RF waveform super positioned on a pulsed DC waveform combined with reverse voltage threshold to a cathode of a sputtering deposition process.

FIG. 7A illustrates a method 700 of applying an RF waveform super positioned on a pulsed DC waveform combined with reverse voltage threshold to a cathode of a sputtering deposition process. The method 700 includes an apply a pulsed DC waveform to a cathode operation 702. The method 700 also includes an apply an RF waveform to a cathode operation 704.

As illustrated, method 700 begins with apply a pulsed DC waveform to a cathode operation 702. In other embodiments, the method 700 begins with an apply an RF waveform to a cathode operation 704. Still in other embodiments, the operations 702 and 704 may occur at the same time.

Figure 7B:
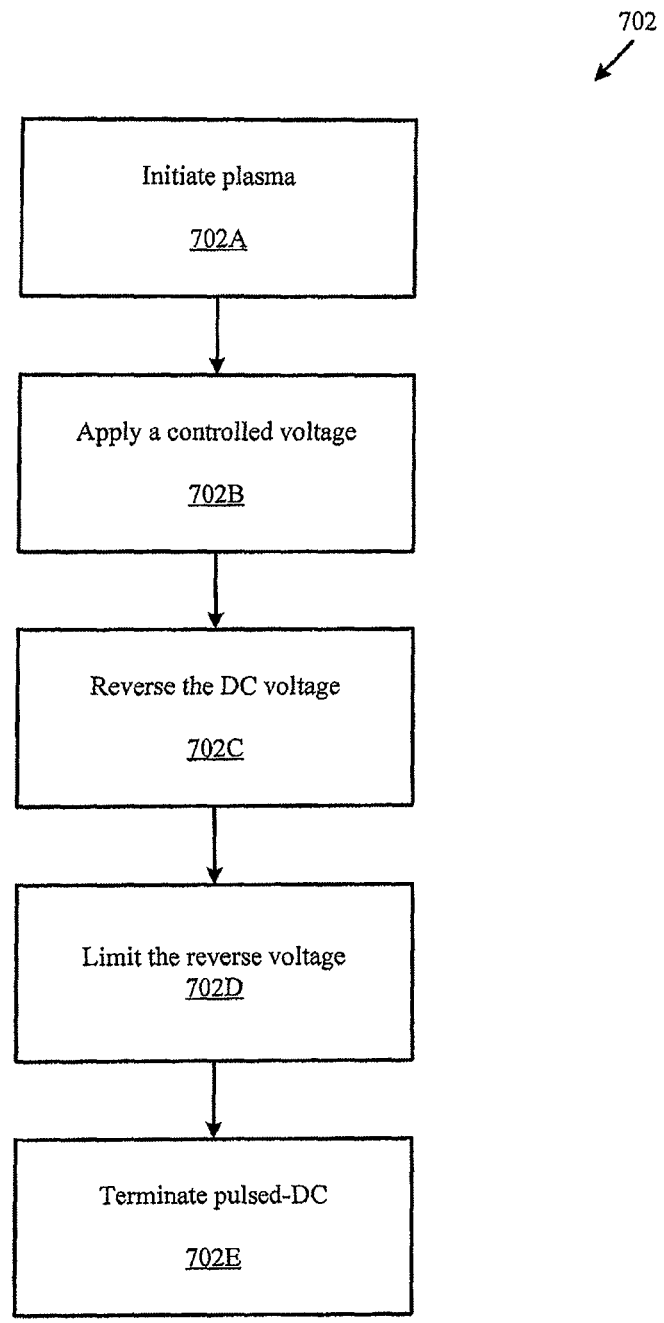
FIG. 7B illustrates the apply a pulsed DC waveform to a cathode operation.

FIG. 7B illustrates the apply a pulsed DC waveform to a cathode operation 702. The applying a pulsed DC waveform operation 702 includes an initiate plasma operation 702A, apply a controlled voltage operation 702B, a reverse the DC voltage operation 702C, a limit the reverse voltage operation 702D, and a terminate pulsed-DC operation 702E.

The apply a DC waveform to a cathode operation 702 begins with an initiate plasma operation 702A. Initiate plasma operation 702A may result in a negative voltage spike for some period of time. For example, the spike lasts for between 0.5 to 10 microseconds in embodiments. In other embodiments, there is no spike, and an initiate plasma operation 702A merely marks the point at which a pulse DC waveform is first applied to a cathode.

The apply a DC waveform to a cathode operation next proceeds to an apply a controlled voltage operation 702B to a cathode operation. This operation results in a DC being applied for some time period at a substantially fixed voltage. For example, a DC waveform may have a controlled voltage operation 702B between −100V and −300V.

Next, operation 702 proceeds to a reverse the DC voltage operation 702C. In an embodiment, reverse the DC voltage operation 702C causes the voltage to be reversed from negative to positive. As mentioned above, the reverse the DC voltage operation 702C may be an active operation as shown or may be a natural result of the termination of the operation 702B. In an embodiment where the original voltage was positive, the reverse the DC voltage operation 702C causes the voltage to be reversed from positive to negative. In an embodiment, the reverse DC voltage operation 702C causes the DC voltage to go to between +50 and +400V absent a limit the reverse voltage operation 702D described below.

A limit the reverse voltage operation 702D limits the degree to which the reverse the DC voltage operation 702C can reverse the voltage applied to the cathode. In embodiments, the limit the reverse voltage operation 702D causes the reverse voltage to be limited to one of the following voltages +50V, +60V, +70V, +80V, +90V, +100V, +110V, +120V, +130V, +140V, +150V, +160V, +170V, +180V, +190V, +200V, +210V, +220V, +230V, +240V, +250V, +260V, +270V, +280V, +290V, +300V, +310V, +320V, +330V, +340V, +350V, +360V, +370V, +380V, +390V, and +400V. A terminate pulsed-DC operation 702E ends the application of the reverse voltage to a cathode. This may occur naturally as a final result of terminating operation 702B.

The reverse voltage limiting operation 702D is presented here as a separate step, although the reader will recognize that the reverse voltage operation 702C, the limiting operation 702D and the DC pulse termination operation 702E may all occur at the same or substantially the same time and may be, in effect, a single operation. In an embodiment in which the reverse voltage is a transient effect caused by the termination of the DC pulse, the limiting operation 702D is achieved by the simultaneous activation of reverse voltage limiting electronics that prevent the reverse voltage from exceeding the set threshold.

In embodiments where the target is non-metallic, the timed activation of the electronics prevents interference with the applied RF waveform or other desired transient elements of the waveform, which would be detrimentally affected if the limiting electronics were active at all times. In an alternative embodiment, although difficult in practice using currently available technology, the entire waveform may be controlled by software so that the exact desired waveform is delivered at the chamber without the need to rely on inherent properties of the hardware to intrinsically create some or all of the waveform (e.g., the reverse voltage).

Figure 7C:
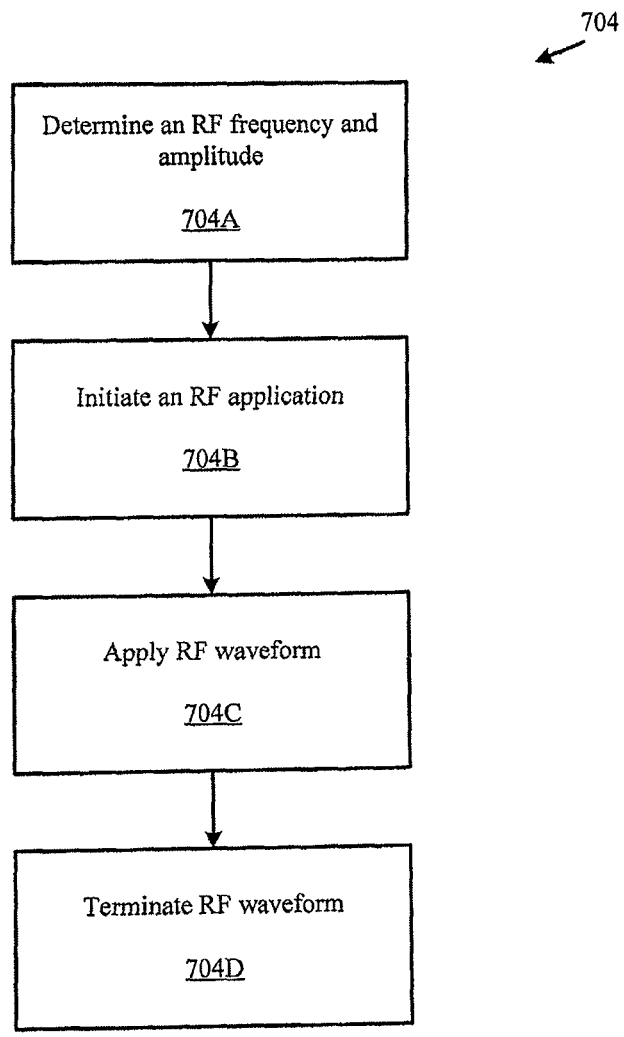
FIG. 7C illustrates an apply an RF waveform operation.

FIG. 7C illustrates an apply an RF waveform operation 704. In an embodiment, the apply an RF waveform operation 704 includes a determine an RF frequency and amplitude operation 704A, an initiate an RF application 704B, an apply an RF operation 704C, and a terminate an RF application 704D.

Apply an RF waveform operation 704 begins with a determine an RF frequency and amplitude operation 704A.

Next an initiate an RF application operation 704B initiates the application of an RF waveform to a cathode. The application of the RF waveform to a cathode continues through apply an RF waveform operation 704C. Apply an RF waveform operation 704C may last for a duration of the apply a controlled voltage operation 702B. Alternatively the apply the RF waveform operation 704C may last for the entire duration of all cycles of pulsed-DC waveform.

A terminate an RF application operation 704D stops the application of an RF waveform to a cathode. In embodiments, the terminate an RF application operation occurs before the limit the reverse voltage operation 702D.

Figure 8:
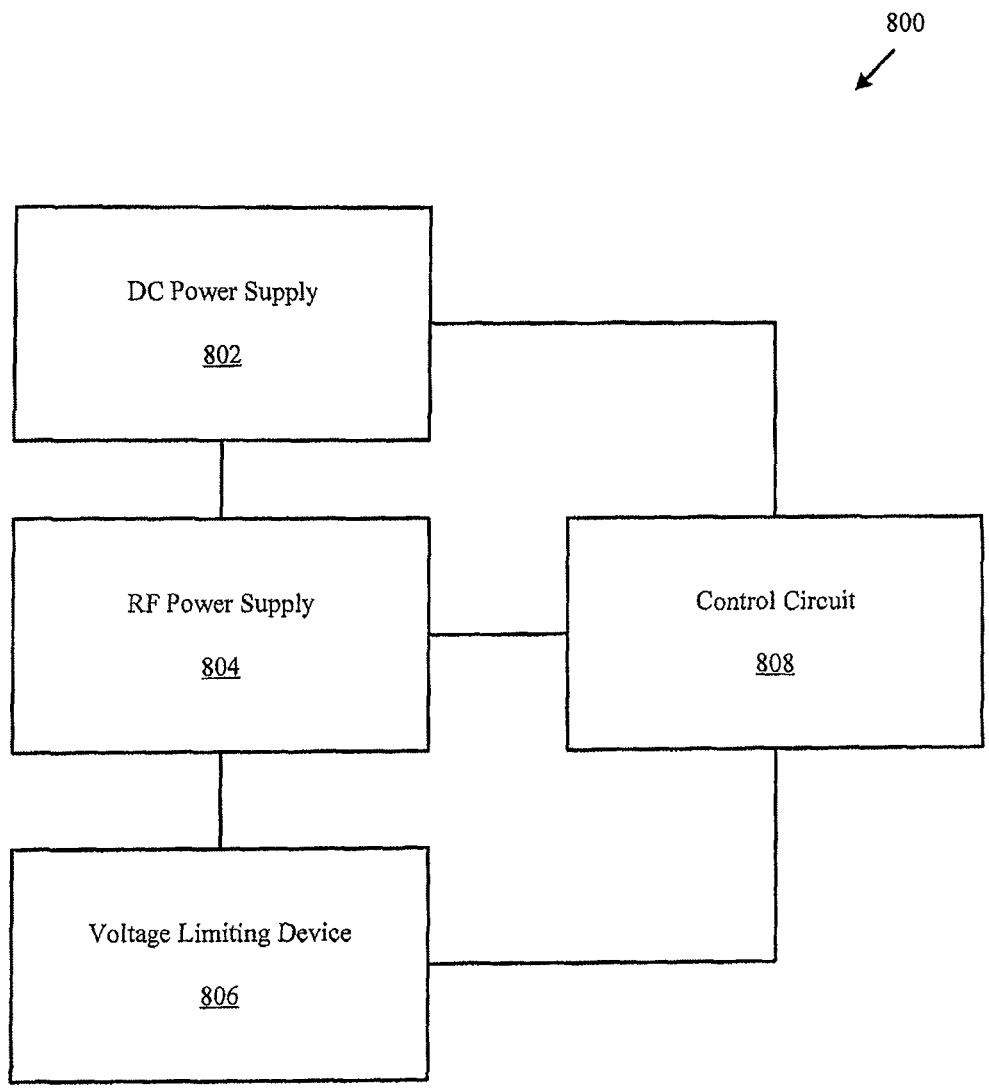
FIG. 8 illustrates a system to apply an RF and pulsed DC waveform combined with reverse voltage threshold to a cathode of a sputtering deposition process.

FIG. 8 illustrates a system to apply an RF and pulsed DC waveform combined with reverse voltage threshold to a cathode of a sputtering deposition process 800. As illustrated, FIG. 8 includes a DC power supply 802, an RF power supply 804, a reverse voltage limiting device 806, and a control circuit 808. The DC power supply 802 applies a pulsed-DC waveform 302 to a cathode of a sputtering deposition chamber. The RF power supply 804 applies an RF waveform 304 to a cathode. A reverse voltage limiting device 806 limits the reverse voltage of a pulsed-DC waveform 302. The reverse voltage limiting device 806 may include any suitable signal modification circuits such as capacitors, inductors, selected low-pass or band-pass filters or other electronics as needed to achieve the desired responsiveness and voltage limiting for the particular application. Additionally, a control circuit 808 controls the interaction and timing of the DC power supply 802, the RF power supply 804, and the activation of the reverse voltage limiting device 806. For example, the control circuit 808 may ensure that the RF power supply 804 turns off prior to the DC power supply 802 applying a reverse DC voltage portion 310 to a cathode of a sputtering process.

It will be clear that the systems and methods described herein are well adapted to attain the ends and advantages mentioned as well as those inherent therein. Those skilled in the art will recognize that the methods and systems within this specification may be implemented in many manners and as such is not to be limited by the foregoing exemplified embodiments and examples. In other words, functional elements being performed by a single or multiple components and individual functions can be distributed among different components. In this regard, any number of the features of the different embodiments described herein may be combined into one single embodiment and alternate embodiments having fewer than or more than all of the features herein described as possible. For example, in an embodiment all the necessary electronics to generate the disclosed waveform may be implemented as part of the power supply. In an alternative embodiment, the control circuit and voltage limiting circuitry may be separately embodied in an independent component that can be used with a prior art power supply capable of delivering pulsed DC waveforms with a modulated RF component.

While various embodiments have been described for purposes of this disclosure, various changes and modifications may be made which are well within the scope of the disclosed methods. Numerous other changes may be made which will readily suggest themselves to those skilled in the art and which are encompassed in the spirit of the disclosure.

What is claimed:

1. A method for controlling the rate of production and energy distribution of ions in a sputtering system, the method comprising:
    applying a first cycle of a pulsed-DC waveform to a cathode of a sputtering deposition chamber, wherein the first cycle of the pulsed-DC waveform includes:
        a plasma initiation portion;
        a steady-state portion;
        a reverse DC voltage portion, wherein the reverse DC voltage portion reverses the polarity of the cathode in the sputtering deposition chamber;
        a reverse limiting threshold, wherein the reverse limiting threshold is set by a controller so as to limit a spike of the reverse DC voltage portion over multiple successive cycles, including the first cycle, of the pulsed-DC waveform, and further wherein the reverse limiting threshold controls a kinetic energy of a plurality of ions accelerating toward a substrate; and
        a pulsed-DC termination point;
    applying a first RF waveform to the cathode of the sputtering deposition chamber during at least the steady-state portion, wherein the RF waveform includes:
        a frequency, and
        an RF application duration.

2. The method of claim 1, wherein the reverse limiting threshold is set at a voltage selected from the group consisting of +50V, +60V, +70V, +80V, +90V, +100V, +110V, +120V, +130V, +140V, +150V, +160V, +170V, +180V, +190V, +200V, +210V, +220V, +230V, +240V, +250V, +260V, +270V, +280V, +290V, +300V, +310V, +320V, +330V, +340V, +350V, +360V, +370V, +380V, +390V, and +400V.

3. The method of claim 1, wherein the steady-state portion of the at least one cycle of a pulsed-DC waveform is set at voltage selected from the group −50V, −60V, −70V, −80V, −90V, −100V, −110V, −120V, −130V, −140V, −150V, −160V, −170V, −180V, −190V, −200V, −210V, −220V, −230V, −240V, −250V, −260V, −270V, −280V, −290V, −300V, −310V, −320V, −330V, −340V, −350V, −360V, −370V, −380V, −390V, −400V, −410V, −420V, −430V, −440V, −450V, −460V, −470V, −480V, −490V, and −500V.

4. The method of claim 1, further comprising after applying the first cycle of a pulsed-DC waveform and after applying the first RF waveform, applying a plurality of pulsed-DC waveforms to the cathode of the sputtering deposition chamber.

5. The method of claim 4, wherein the application of the plurality of pulsed: DC waveforms is applied at a cycle selected from the group consisting of 10 kHz, 20 kHz, 30 kHz, 40 kHz, 50 kHz, 60 kHz, 70 kHz, 80 kHz, 90 kHz, 100 kHz, 110 kHz, 120 kHz, 130 kHz, 140 kHz, 150 kHz, 160 kHz, 170 kHz, 180 kHz, 190 kHz, 200 kHz, 210 kHz, 220 kHz, 230 kHz, 240 kHz, 250 kHz, 260 kHz, 270 kHz, 280 kHz, 290 kHz, 300 kHz, 310 kHz, 320 kHz, 330 kHz, 340 kHz, 350 kHz, 360 kHz, 370 kHz, 380 kHz, 390 kHz, 400 kHz, 410 kHz, 420 kHz, 430 kHz, 440 kHz, 450 kHz, 460 kHz, 470 kHz, 480 kHz, 490 kHz, and 500 kHz.

6. The method of claim 1 wherein the RF waveform further includes: an RF termination point, wherein the RF termination point occurs prior to the reverse DC voltage portion of the cycle of the pulsed-DC waveform.

7. A system for controlling the power applied to a cathode of a sputtering deposition chambers, the system comprising:
a pulsed-DC power supply, wherein the pulsed DC-power supply applies a waveform to the cathode such that the waveform includes:
a plasma initiation portion;
a steady-state portion;
a reverse DC voltage portion, wherein the reverse DC voltage portion reverses the polarity of the cathode in a sputtering deposition chamber;
an RF power supply;
a voltage limiting device, wherein the voltage limiting device has a reverse limiting threshold that limits an amount of voltage applied to the cathode during the reverse DC voltage portion of at least two successive cycles, and further wherein the reverse limiting threshold controls a kinetic energy of a plurality of ions accelerating toward a substrate; and
a control circuit, wherein the control circuit is designed to control the pulsed-DC power supply, the RF power supply, and the reverse voltage limiting device.

8. The system of claim 7, wherein the reverse limiting threshold voltage is selected from the group consisting of +50V, +60V, +70V, +80V, +90V, +100V, +110V, +120V, +130V, +140V, +150V, +160V, +170V, +180V, +190V, +200V, +210V, +220V, +230V, +240V, +250V, +260V, +270V, +280V, +290V, +300V, +310V, +320V, +330V, +340V, +350V, +360V, +370V, +380V, +390V, and +400V.

9. The system of claim 7, wherein the steady-state portion is set at voltage selected from the group consisting of −50V, −60V, −70V, −80V, −90V, −100V, −110V, −120V, −130V, −140V, −150V, −160V, −170V, −180V, −190V, −200V, −210V, −220V, −230V, −240V, −250V, −260V, −270V, −280V, −290V, −300V, −310V, −320V, −330V, −340V, −350V, −360V, −370V, −380V, −390V, −400V, −410V, −420V, −430V, −440V, −450V, −460V, −470V, −480V, −490V, and −500V.

10. The system of claim 7, further comprising the DC power supply applying a plurality of pulsed-DC waveforms to the cathode.

11. The system of claim 10, wherein the application of the plurality of pulsed-DC waveforms is applied at a cycle selected from the group consisting of 10 kHz, 20 kHz, 30 kHz, 40 kHz, 50 kHz, 60 kHz, 70 kHz, 80 kHz, 90 kHz, 100 kHz, 110 kHz, 120 kHz, 130 kHz, 140 kHz, 150 kHz, 160 kHz, 170 kHz, 180 kHz, 190 kHz, 200 kHz, 210 kHz, 220 kHz, 230 kHz, 240 kHz, 250 kHz, 260 kHz, 270 kHz, 280 kHz, 290 kHz, 300 kHz, 310 kHz, 320 kHz, 330 kHz, 340 kHz, 350 kHz, 360 kHz, 370 kHz, 380 kHz, 390 kHz, 400 kHz, 410 kHz, 420 kHz, 430 kHz, 440 kHz, 450 kHz, 460 kHz, 470 kHz, 480 kHz, 490 kHz, and 500 kHz.

12. The system of claim 7 wherein the RF power supply applies a waveform to the cathode such that the waveform includes: a frequency, an RF application duration, and an RF termination point.

13. A method for controlling the rate of production and energy distribution of ions in a sputtering system, the method comprising:
applying a first pulsed DC waveform to a cathode of a sputtering deposition chamber;
applying a first RF waveform to the cathode of a sputtering deposition chamber;
applying a first controlled voltage to the cathode;
reversing the first controlled voltage a first time;
limiting a first reverse voltage so as to control a first spike during the reversing the voltage a first time step such that a kinetic energy of a first plurality of ions accelerating toward a substrate is decreased;
terminating the pulsed-DC waveform;
applying a second pulsed DC waveform to the cathode of a sputtering deposition chamber;
applying a second RF waveform to the cathode of a sputtering deposition chamber; applying a second controlled voltage to the cathode;
reversing the controlled voltage a second time;
limiting a second reverse voltage so as to control a second spike during the reversing the voltage a second time step such that a second kinetic energy of a second plurality of ions accelerating toward the substrate is decreased, wherein the reverse voltage and the second reverse voltage occur in successive cycles; and
and terminating the second pulsed-DC waveform.

14. The method of claim 13, wherein the applying a first RF waveform to the cathode step further comprises:
initiating an RF application; and
terminating an RF application.

15. The method of claim 13, wherein the applying a first pulsed DC waveform step occurs after the applying a first RF waveform step.

16. The method of claim 13, wherein the limiting the reverse voltage a first time step comprises limiting the voltage to a voltage selected from the group consisting of +50V, +60V, +70V, +80V, +90V, +100V, +110V, +120V, +130V, +140V, +150V, +160V, +170V, +180V, +190V, +200V, +210V, +220V, +230V, +240V, +250V, +260V, +270V, +280V, +290V, +300V, +310V, +320V, +330V, +340V, +350V, +360V, +370V, +380V, +390V, and +400V.

17. The method of claim 13, wherein the applying a first controlled voltage step applies the controlled voltage at voltage selected from the group −50V, −60V, −70V, −80V, −90V, −100V, −110V, −120V, −130V, −140V, −150V, −160V, −170V, −180V, −190V, −200V, −210V, −220V, −230V, −240V, −250V, −260V, −270V, −280V, −290V, −300V, −310V, −320V, −330V, −340V, −350V, −360V, −370V, −380V, −390V, −400V, −410V, −420V, −430V, −440V, −450V, −460V, −470V, −480V, −490V, and −500V.

* * * * *